United States Patent
Uchimoto et al.

(10) Patent No.: US 7,403,049 B2
(45) Date of Patent: Jul. 22, 2008

(54) TRIANGULAR WAVE GENERATION CIRCUIT

(75) Inventors: Daisuke Uchimoto, Kyoto (JP); Manabu Oyama, Kyoto (JP)

(73) Assignee: Rohm Co., Ltd. (JP)

( * ) Notice: Subject to any disclaimer, the term of this patent is extended or adjusted under 35 U.S.C. 154(b) by 141 days.

(21) Appl. No.: 11/513,545

(22) Filed: Aug. 31, 2006

(65) Prior Publication Data

US 2007/0057707 A1 Mar. 15, 2007

(30) Foreign Application Priority Data

Sep. 6, 2005 (JP) ............................. 2005-257396

(51) Int. Cl.
*H03K 4/06* (2006.01)

(52) U.S. Cl. .................... 327/131; 323/242; 323/288; 323/326

(58) Field of Classification Search ................ 327/131; 323/242, 288, 326
See application file for complete search history.

(56) References Cited

U.S. PATENT DOCUMENTS

2007/0052459 A1 * 3/2007 Ikezawa ..................... 327/131

FOREIGN PATENT DOCUMENTS

| JP | 2001-345682 | 12/2001 |
|----|-------------|---------|
| JP | 2004-072657 | 3/2004  |

* cited by examiner

*Primary Examiner*—N. Drew Richards
*Assistant Examiner*—Daniel Rojas
(74) *Attorney, Agent, or Firm*—Cantor Colburn LLP

(57) ABSTRACT

A first constant-current source supplies a charging current to a second terminal of a first capacitor in which a first terminal is grounded. A first terminal of a second capacitor is grounded, and a first switch is provided between the second terminal of the first capacitor and a second terminal of the second capacitor. A second constant-current source supplies current to the second capacitor, and a second switch is provided on a current path of the second constant-current source. A third constant-current source draws out current from the first capacitor and the second capacitor. A switch controller turns on the first switch and turns off the second switch when an output voltage appearing in the second terminal of the first capacitor reaches a predetermined upper-limit voltage. The switch controller turns off the first switch and turns on the second switch when the output voltage drops to a predetermined lower-limit voltage.

12 Claims, 5 Drawing Sheets

PRIOR ART

50

200

TRIANGULAR WAVE GENERATION CIRCUIT

BACKGROUND OF THE INVENTION

1. Field of the Invention

The present invention relates to a triangular wave generation circuit for generating triangular waves at a predetermined frequency.

2. Description of the Related Art

Pulse-width modulation techniques are widely used for power supply units such as switching regulators, or motor driver circuits for driving motors, and the like. For a pulse-width modulation, the error of a voltage to be controlled in relation to a target voltage is amplified by an error amplifier, and the error voltage resulting therefrom is compared by a comparator with a periodic voltage with a triangular waveform having a fixed frequency.

To generate periodic voltages of triangular waveforms used in applications as mentioned above, analog triangular wave generation circuits as described in Reference (1) and Reference (2) in the following Related Art List are used widely. FIG. 3 is a circuit diagram illustrating a partially simplified structure of a triangular wave generation circuit as described in References (1) and (2). A conventional triangular wave generation circuit 50 includes a capacitor CT, constant-current sources 52 and 54 for charging and discharging the capacitor CT respectively, two comparators 56 and 58 for setting the upper limit value VH and the lower limit value VL of output voltage respectively, and a flip-flop 60, and a switch SW.

In a known triangular wave generation circuit 50 as shown in FIG. 3, the capacitor CT is charged by the constant-current source 52, and as the output voltage Vout reaches the upper limit value VH, the switch SW is turned on and the electric charge stored in the capacitor CT is discharged by the constant-current source for discharge 54 to lower the output voltage Vout with a constant rate. As the output voltage Vout reaches the lower limit value VL, the switch SW is turned off and the capacitor CT is charged by the constant-current source for charge 52 to raise the output voltage Vout with a constant rate. In this manner, output from the triangular wave generation circuit 50 is an output voltage Vout of a triangular waveform that repeats rising and lowering between the upper limit value VH and the lower limit value VL.

Related Art List
(1) Japanese Patent Application Laid-Open No. 2004-72657.
(2) Japanese Patent Application Laid-Open No. 2001-345682.

FIGS. 4A and 4B are voltage waveform diagrams of a triangular wave generation circuit 50 as shown in FIG. 3. FIG. 4A shows the output voltage Vout, whereas FIG. 4B shows the voltage Vx at the connection point between the constant-current source 54 and the switch SW. During the period of charging by the constant-current source 52, that is, during the period when the output voltage Vout rises, the switch SW is off, so that the collector or drain of a transistor constituting the constant-current source 54 opens and the voltage Vx is down at ground potential.

When the output voltage Vout reaches the upper limit value VH, the switch SW turns on and discharging by the constant-current source 54 starts. At this time, the electric charge stored in the capacitor CT flows suddenly toward the constant-current source 54, so that the output voltage Vout drops with a steep slope as shown in FIG. 4A and then lowers with a constant rate toward the lower limit value VL.

As described above, the conventional triangular wave generation circuit 50 has a problem that the waveform of the output voltage Vout gets distorted at the time of a charge state switching to a discharge state. This problem can be solved to a certain degree by using a capacitor CT of a larger capacitance, but this brings on another problem of an enlarged circuit area. Moreover, the use of a larger capacitance, which requires the use of larger constant current for charging and discharging, brings about a problem of larger current consumption.

SUMMARY OF THE INVENTION

The present invention has been made in view of the foregoing circumstances, and a general purpose thereof is to provide a triangular wave generation circuit with an improved waveform of the output voltage.

A triangular wave generation circuit according to one embodiment of the present invention comprises: a first capacitor in which potential of a first terminal is fixed; a first constant-current source which supplies current to a second terminal of said first capacitor; a second capacitor in which potential of a first terminal is fixed; a second constant-current source which supplies current to a second terminal of the second capacitor; a first switch provided between the second terminal of the first capacitor and the second terminal of the second capacitor; a second switch provided on a current path of the second constant-current source; a third constant-current source which draws current from the first capacitor and the second capacitor; and a switch controller which turns on the first switch and turns off the second switch when an output voltage appearing in the second terminal of the first capacitor reaches a predetermined upper-limit voltage and which turns off the first switch and turns on the second switch when the output voltage drops to a predetermined lower-limit voltage.

The first capacitor is charged by the first constant-current source during a charge period in which the first switch is off and the second switch is on. At the same time, the second capacitor is discharged by the second constant-current source and charged by the third constant-current source. During a discharge period in which the first switch is on and the second switch is off, both the first capacitor and the second capacitor are discharged by the first constant-current source and are charged by the third constant-current source. As a result, the voltage at the second terminal of the second capacitor varies as the output voltage rises or falls.

According to this embodiment, since one end of the third constant-current source is connected to the second capacitor, it doesn't open and it is fixed to a potential determined by the charge amount stored in the second capacitance. As a result, when the first switch turns on and the second terminal of the first capacitor is connected with the second terminal of the second capacitor, the precipitous drop of the output voltage is prevented and therefore a triangular wave voltage whose waveform has less distortion can be generated.

The capacitance value of the first capacitor is set equal to that of the second capacitor, and the ratio among values of constant currents generated by the first constant-current source, the second constant-current source and the third constant-current source may be set to 1:4:3.

In this case, if the ratio "1" is denoted by Ic, both the first capacitor and the second capacitor are charged by the current Ic during a charge period. In a discharge period, the combined capacitor of the first capacitor and the second capacitor will be discharged at 2Ic. Since the capacitance value of the first capacitor is equal to that of the second capacitor, these two capacitors vary in the same manner. As a result, the property that the first capacitor and the second capacitor are mutually compatible and consistent in terms of the voltage variation can be enhanced and therefore the waveform of triangular wave can be further improved.

The switch controller may include: a first comparator which compares the output voltage with the lower-limit voltage; a second comparator which compares the output voltage with the upper-limit voltage; and a flip-flop which is set or reset in accordance with an output of the first comparator and an output of the second comparator, wherein the switch controller may complementarily turn on and off the first switch and said second switch, based on an output of the flip-flop.

The switch controller may include a hysteresis comparator that compares the output voltage with the upper-limit voltage and the lower-limit voltage serving as threshold value voltages, and the switch controller may complementarily turn on and off the first switch and the second switch, based on an output of the hysteresis comparator.

The above-described triangular wave generation circuit may be integrally integrated into a semiconductor integrated circuit. "Being integrally integrated" includes a case where all of circuit components are formed on a semiconductor substrate or a case where main circuit components are integrally integrated thereon. Note that part of resistors or capacitors used to adjust circuit constants may be provided externally to the semiconductor substrate.

Another embodiment of the present invention relates to a pulse-width modulator. This pulse-width modulator comprises: the above-described triangular wave generation circuit; an error amplifier which amplifies error between a voltage to be controlled and a predetermined reference voltage; and a comparator which compares an error voltage output from the error amplifier and an output voltage of the triangular wave generation circuit. According to this embodiment, pulse-width modulation signals can be produced based on highly accurate triangular wave signals.

Still another embodiment of the present invention relates to a switching regulator. This switching regulator includes the above-described pulse-width modulator.

It is to be noted that any arbitrary combination or rearrangement of the above-described structural components and so forth are all effective as and encompassed by the present embodiments.

Moreover, this summary of the invention does not necessarily describe all necessary features so that the invention may also be sub-combination of these described features.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 1:
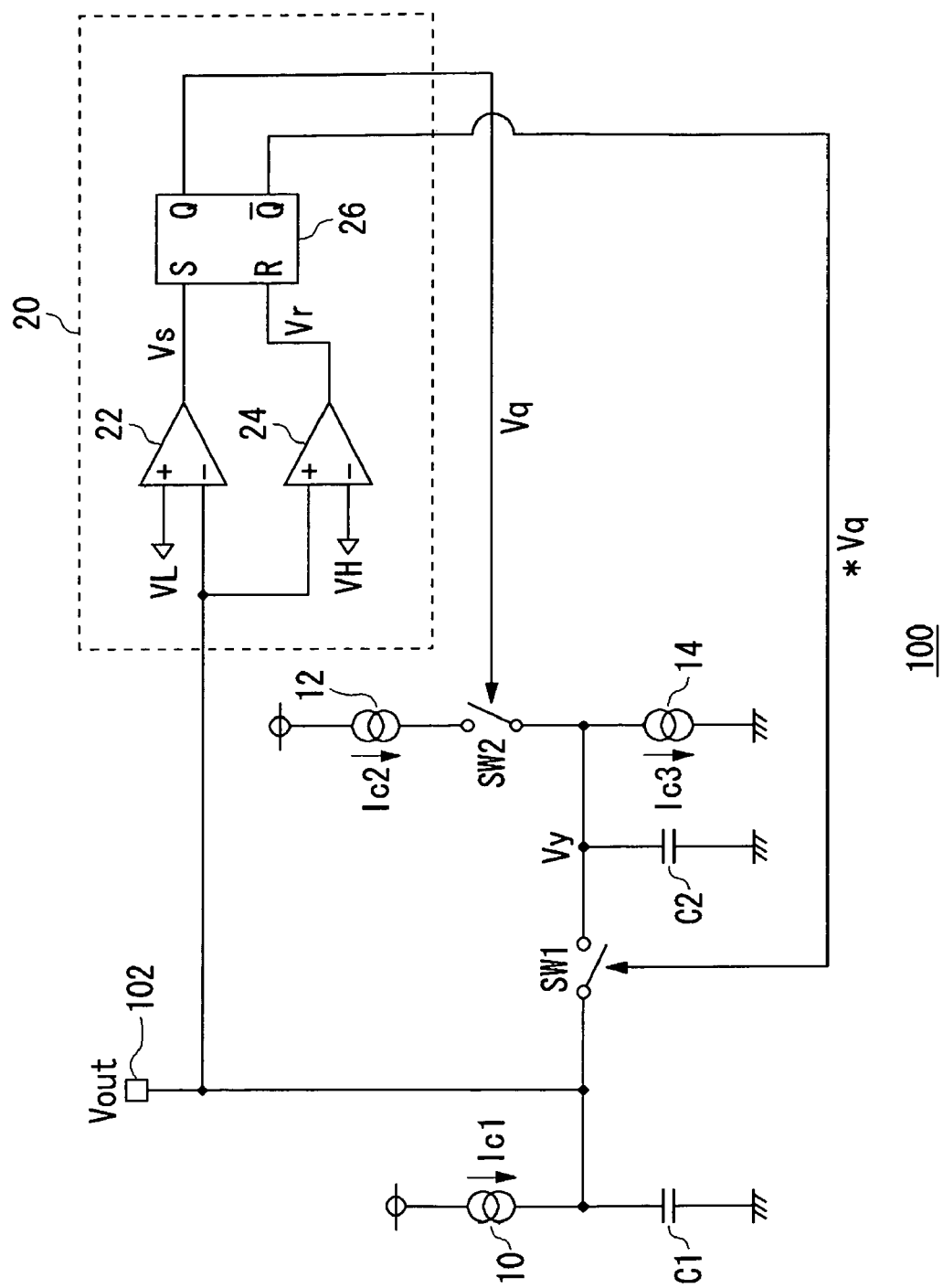
FIG. 1 is a circuit diagram showing a structure of a triangular wave generation circuit according to an embodiment of the present invention.

FIG. 1 is a circuit diagram showing a structure of a triangular wave generation circuit 100 according to an embodiment of the present invention. The triangular wave generation circuit 100 is comprised of a first capacitor C1, a second capacitor C2, a first constant-current source 10, a second constant-current source 12, a third constant-current source 14, a switch controller 20, a first switch SW1, and a second switch SW2.

The first terminal of the first capacitor C1 is grounded, and the potential is fixed. The first constant-current source 10 is connected to a second terminal of the first capacitor C1 and supplies a charging current to the second terminal of the first capacitor C1. Here the current generated by the first constant-current source 10 is designated "first constant current Ic1". The second capacitor C2 is provided in parallel with the first capacitor C1, and the first terminal thereof is grounded and the potential is fixed. The first switch SW1 is provided between the second terminal of the first capacitor C1 and a second terminal of the second capacitor C2. According to the present embodiment, the capacitance values of the first capacitor C1 and the second capacitor C2 are set equal to each other. Hereinbelow, the capacitance values of the first capacitor C1 and the second capacitor C2 are denoted by "unit capacitance Cu". Also, in this specification, the reference numbers attached to a voltage signal, a current signal, or a capacitance are, as appropriate, used as representing the voltage value, the current value, or the capacitance value, respectively.

The second constant-current source 12 is connected to the second terminal of the second capacitor C2 via the second switch SW2. Here the current generated by the second constant-current source 12 is designated "second constant current Ic2". As the second switch SW2 provided on the current path of the second constant-current source 12 is turned on, the second capacitor C2 is charged by the second constant current Ic2 generated by the second constant-current source 12. Hereinbelow, the voltage at the second terminal of the second capacitor C2 is denoted by "second voltage Vy".

The third constant-current source 14 is directly connected to the second terminal of the second capacitor C2 and also connected to the second terminal of the first capacitor C1 via the first switch SW1. The third constant-current source 14 generates the third constant current Ic3, thereby drawing out the constant current Ic3 from the first capacitor C1 and the second capacitor C2. According to the present embodiment, the ratio among the first constant current Ic1, the second constant current Ic2, and the third constant current Ic3 is set at 1:4:3.

The voltage at the second terminal of the first capacitor C1 is output from the output terminal 102 as an output voltage Vout from the triangular wave generation circuit 100. This output voltage Vout is also input to the switch controller 20.

The switch controller 20 includes a first comparator 22, a second comparator 24 and an RS flip-flop 26.

The output voltage Vout is input to the inverting input terminal of the first comparator 22, and the lower-limit voltage VL for setting the lower limit of the triangular wave is input to the noninverting input terminal thereof. The first comparator 22 compares the output voltage Vout with the lower-limit voltage VL and outputs a set signal Vs for setting a high level when Vout<VL or a low level when Vout>VL.

The output voltage Vout is input to the noninverting input terminal of the second comparator 24, and the upper-limit voltage VH for setting the upper limit of the triangular wave is input to the inverting input terminal thereof. The second comparator 24 compares the output voltage Vout with the upper-limit voltage VH and outputs a reset signal Vr for setting a high level when Vout>VH or a low level when Vout<VH.

The set signal Vs output from the first comparator 22 is input to the set terminal of the RS flip-flop 26, and the reset signal Vr output from the second comparator 24 is input to the reset terminal thereof. The on and off of the first switch SW1 and the second switch SW2 are controlled complementarily according to the output of the RS flip-flop 26.

The output signal Vq of the RS flip-flop 26 is output to the second switch Sw2. The second switch SW2 turns on when the output signal Vq is high and turns off when it is low. The inverted output signal *Vq of the RS flip-flop 26 is output to the first switch SW1. The first switch SW1 turns on when the inverted output signal *Vq is high and turns off when it is low.

As the output voltage Vout reaches a predetermined upper-limit voltage VH, the RS flip-flop 26 so constituted as described above turns on the first switch SW1 and at the same time turns off the second switch SW2. Then, as the output voltage Vout goes down to a predetermined lower-limit voltage VL, the RS flip-flop 26 turns off the first switch SW1 and at the same time turns on the second switch SW2.

Figure 2:
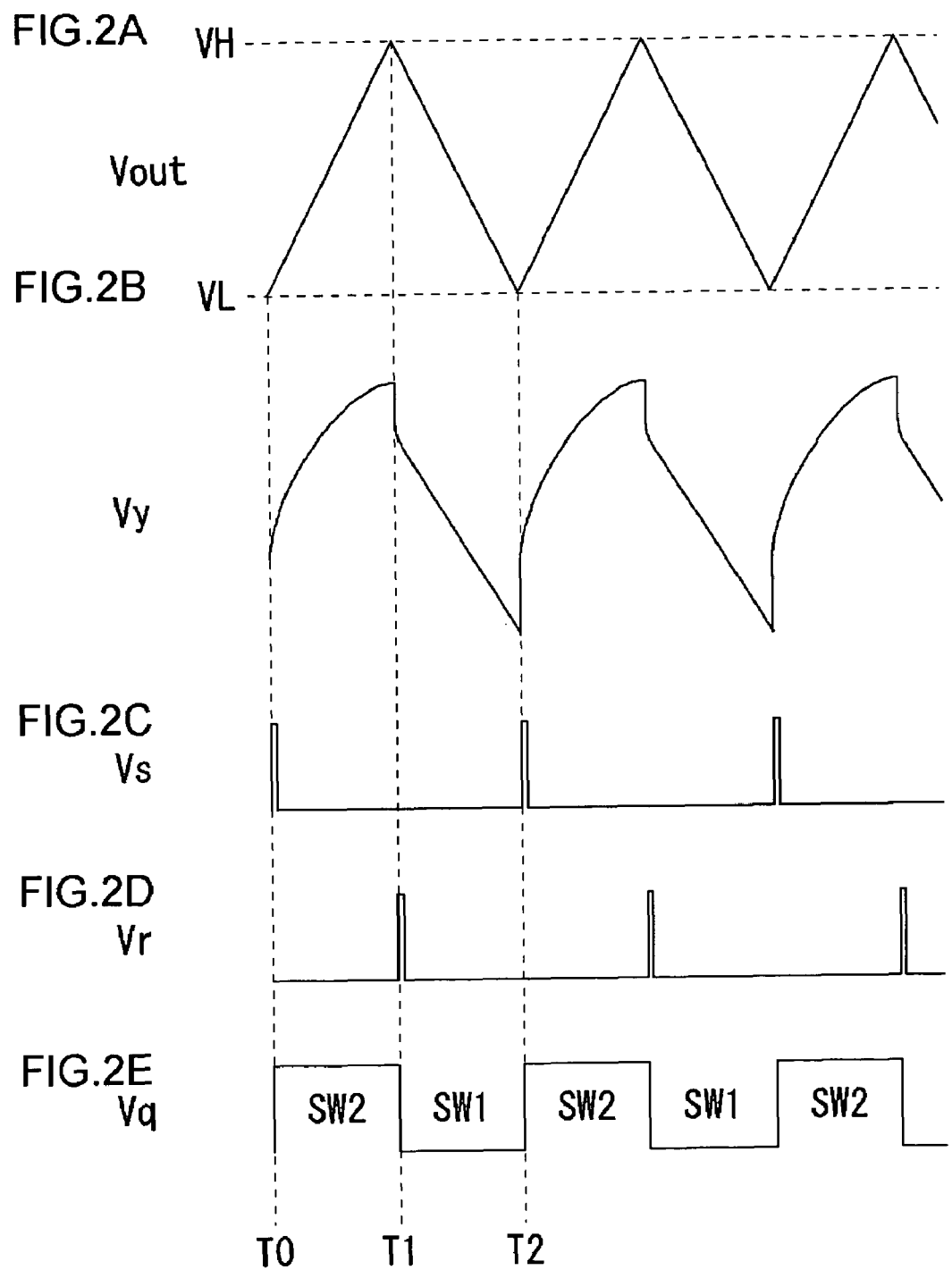
FIGS. 2A to 2E are voltage waveform diagrams of a triangular wave generation circuit shown in FIG. 1.

A description is now given of an operation of the triangular wave generation circuit 100 structured as above. FIGS. 2A to 2E are voltage waveform diagrams of a triangular wave generation circuit 100 as shown in FIG. 1 according to the present embodiment. FIG. 2A shows an output voltage Vout, FIG. 2B a second voltage Vy, FIG. 2C a set signal Vs, FIG. 3D a reset signal Vr, and FIG. 2E an output signal Vq of an RS flip-flop 26.

During the charge period of time T0 to T1, the output signal Vq of the RS flip-flop 26 is high, and therefore the second switch SW2 is on and the first switch SW1 is off. During this period, the first capacitor C1 is charged with the first constant current Ic1 generated by the first constant-current source 10, and the output voltage Vout rises at a slope of Ic1/C1=Ic/Cu. At this time, since the second capacitor C2 is discharged by the third constant-current source 14 while it is charged by the second constant-current source 12, the second voltage Vy rises at a slope of (Ic2−Ic3)/C2=(4Ic−3Ic)/Cu=Ic/Cu.

When the output voltage Vout reaches the upper-limit voltage VH at time T1, the output Vr of the second comparator goes high to reset the RS flip-flop 26. When the RS flip-flop 26 is reset and the output signal Vq thereof goes low, the first switch SW1 turns on and the second switch SW2 turns off.

As the first switch SW1 turns on, there occurs transfer of electric charge between the first capacitor C1 and the second capacitor C2 so as to equalize the output voltage Vout with the second voltage Vy. Then comes a discharge period in which the first capacitor C1 and the second capacitor C2 are discharged by the third constant-current source 14 while they are charged by the first constant-current source 10. During the discharge period, the output voltage Vout and the second voltage Vy both go down at the rate of (Ic3−Ic1)/(C1+C2)= (3Ic−Ic)/2Cu=Ic/Cu, so that the output voltage Vout can be changed with the same rate as during the charge period.

When the output voltage Vout goes down to the lower-limit voltage VL at time T2, the output signal Vs of the first comparator 22 goes high. As a result, the RS flip-flop 26 is set and the output signal Vq thereof goes high again, thus causing a transition to another charge period. The triangular wave generation circuit 100 according to the present embodiment generates an output voltage Vout of a triangular wave by repeating the cycle of a charge period and a discharge period represented by time T0 to T1 and time T1 to T2, respectively.

Figure 3:
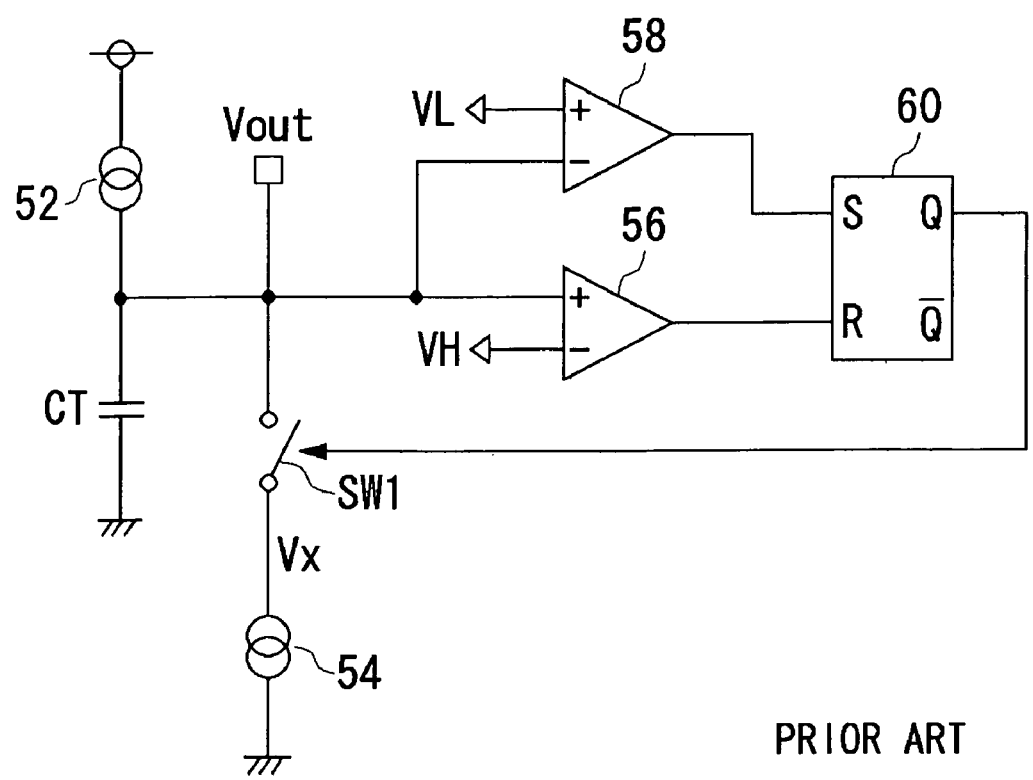
FIG. 3 is a circuit diagram illustrating a partially simplified structure of the conventional triangular wave generation circuits.
Figure 4A:
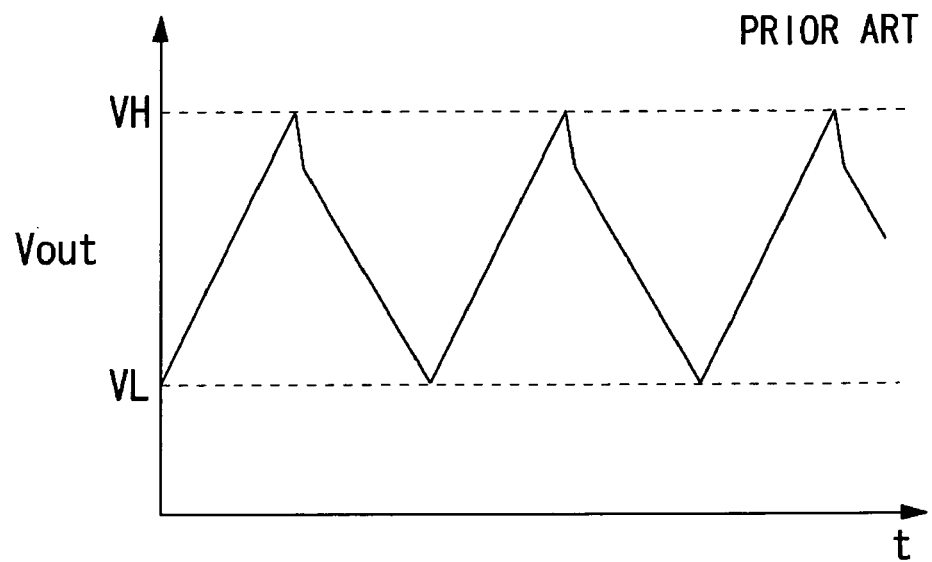
FIGS. 4A and 4B are voltage waveform diagrams of a triangular wave generation circuit 50 shown in FIG. 3.
Figure 4B:
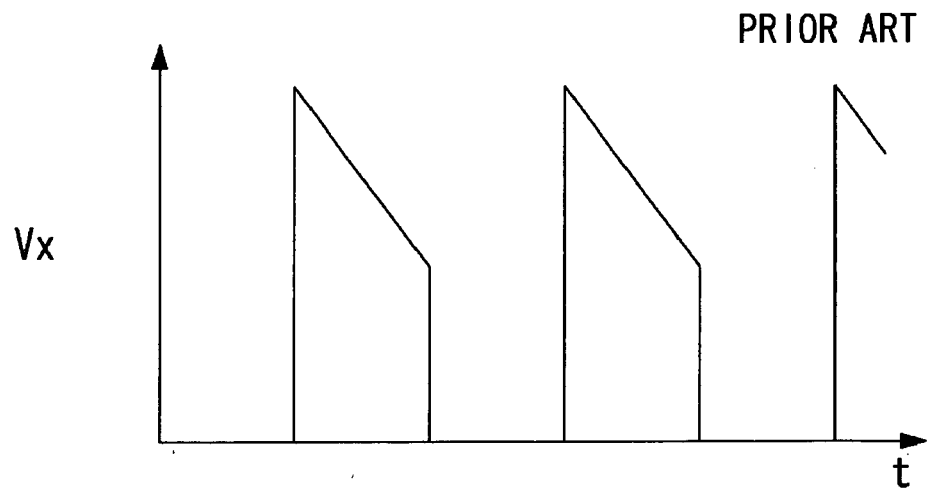

In a conventional triangular wave generation circuit 50 as shown in FIG. 3, the voltage Vx at one end of the constant-current source 54 is down at ground potential during the charge period, as shown in FIG. 4B, and as a result, at the transition from the charge period to the discharge period, the output voltage Vout drops precipitously and then goes down with a constant rate. In contrast to this, in a triangular wave generation circuit 100 according to the present embodiment, electric charge is stored in the second capacitor C2 during the charge period, so that the second voltage Vy, which is the voltage at one end of the third constant-current source 14 for charging, is changed in synchronism with the output voltage Vout. As a result, the transfer of electric charge between the first capacitor C1 and the second capacitor C2 can be minimized at the transition from the charge period to the discharge period, and a waveform close to an ideal triangular wave can be generated by preventing the precipitous change of output voltage Vout.

Also, the same capacitance value is set for the first capacitor C1 and the second capacitor C2, and the ratio among the constant currents generated by the first constant-current source 10, the second constant-current source 12, and the third constant-current source 14 is set at 1:4:3, so that an ideal triangular wave can be generated with the output voltage Vout and the second voltage Vy rising and falling with the same slope.

With a triangular wave generation circuit 50 as shown in FIG. 3, it is necessary to raise the capacitance of the capacitor CT to a certain degree so as to reduce the distortion of the waveform of triangular wave voltage at the transition from the charge period to the discharge period. In contrast to this, with a triangular wave generation circuit 100 according to the present embodiment, the circuit configuration itself is used to reduce the distortion of the waveform of the triangular wave, so that the current consumption of the circuit can be held low by setting the capacitance of the first capacitor C1 and the second capacitor C2 small and further setting the constant currents Ic1, Ic2, and Ic3 low.

Figure 5:
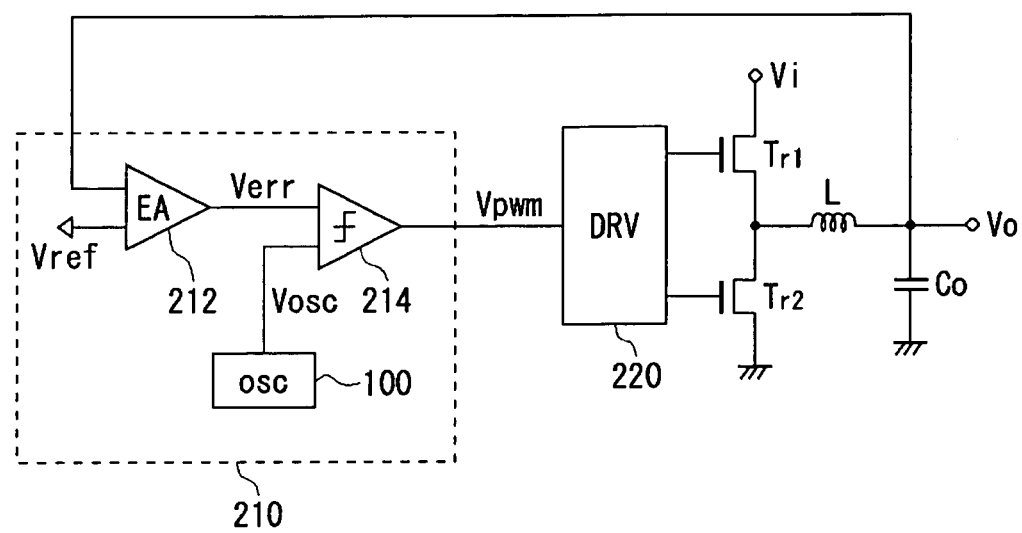
FIG. 5 is a circuit diagram showing a structure of a switching regulator provided with a triangular wave generation circuit of FIG. 1.

The triangular wave generation circuit 100 according to the present embodiment may be suitably used as a circuit for pulse-width modulation, such as a switching regulator. FIG. 5 is a circuit diagram showing a structure of a switching regulator 200 provided with a triangular wave generation circuit 100 of FIG. 1. The switching regulator 200, which is a step-down type switching regulator capable of outputting stepped-down input voltage Vi, includes a pulse-width modulator 210, a driver circuit 220, a switching transistor Tr1, a synchronous rectifier transistor Tr2, an inductor L, and an output capacitor Co. A description of the switching regulator is omitted because its structure is generally known.

The pulse-width modulator 210 includes a triangular wave generation circuit 100 as shown in FIG. 1, an error amplifier 212, and a comparator 214. The error amplifier 212 amplifies the error of an output voltage Vout to be controlled in relation to a predetermined reference voltage Vref. The comparator 214 compares an error voltage Verr output from the error amplifier 212 with an output voltage Vosc of the triangular wave generation circuit 100. Output from the pulse-width modulator 210 configured as described above is a pulse-width modulation signal Vpwm, which has the pulse width changing according to the error of the output voltage Vo in relation to the reference voltage Vref. The driver circuit 220 stabilizes the output voltage Vo at the reference voltage Vref by turning the switching transistor Tr1 and the synchronous rectifier transistor Tr2 on and off complementarily based on the pulse-width modulation signal Vpwm.

The above embodiments are merely exemplary and it is understood by those skilled in the art that various modifications to the combination of each component and process thereof are possible and such modifications are also within the scope of the present invention.

The switch controller 20 as shown in FIG. 1 is functionally equivalent to a hysteresis comparator that makes a comparison with the output voltage Vout with the upper-limit voltage VH and the lower-limit voltage VL as the threshold voltages. Hence, the switch controller 20 is not limited to a structure as shown in FIG. 1, and it may be a hysteresis comparator so configured with a positive feedback applied to an operational amplifier. Such an arrangement can make the scale of the circuit smaller.

According to the present embodiment, the same capacitance value is set for the first capacitor C1 and the second capacitor C2, and further the ratio among the first constant current Ic1, the second constant current Ic2, and the third constant current Ic3 is set at 1:4:3, but the present invention is not limited to this arrangement. It is possible to have the voltages rise and fall with different rates or slopes by appropriately setting the capacitance values and current values according to the waveform of the triangular wave to be generated.

The high-level and low-level settings of logical values as described in the embodiments are examples, and they can be changed freely by appropriately inverting them by an inverter or the like.

In the embodiment, a description has been given of a case where a pulse-width modulator 210 provided with a triangular wave generation circuit 100 is used for a step-down type switching regulator. However, the use of a triangular wave generation circuit 100 is not limited to such an application; it may also be applied to a boost switching regulator instead. Furthermore, the application is not limited to switching regulators, and it may be widely used in motor drive circuits and other circuits that perform feedback control by pulse-width modulation.

While the preferred embodiments of the present invention have been described using specific terms, such description is for illustrative purposes only, and it is to be understood that changes and variations may be further made without departing from the spirit or scope of the appended claims.

What is claimed is:

1. A triangular wave generation circuit, comprising:
a first capacitor in which potential of a first terminal is fixed;
a first constant-current source which supplies current to a second terminal of said first capacitor;
a second capacitor in which potential of a first terminal is fixed;
a second constant-current source which supplies current to a second terminal of said second capacitor;
a first switch provided between the second terminal of said first capacitor and the second terminal of said second capacitor;
a second switch provided on a current path of said second constant-current source;
a third constant-current source which draws current from said first capacitor and said second capacitor; and
a switch controller which turns on said first switch and turns off said second switch when an output voltage appearing in the second terminal of said first capacitor reaches a predetermined upper-limit voltage and which turns off said first switch and turns on said second switch when the output voltage drops to a predetermined lower-limit voltage.

2. A triangular wave generation circuit according to claim 1, wherein a capacitance value of said first capacitor is set equal to that of said second capacitor, and
wherein the ratio among values of constant currents generated by said first constant-current source, said second constant-current source and said third constant-current source is set to 1:4:3.

3. A triangular wave generation circuit according to claim 1, wherein said switch controller includes:
a first comparator which compares the output voltage with the lower-limit voltage;
a second comparator which compares the output voltage with the upper-limit voltage; and
a flip-flop which is set or reset in accordance with an output of the first comparator and an output of the second comparator,
wherein said switch controller complementarily turns on and off said first switch and said second switch, based on an output of the flip-flop.

4. A triangular wave generation circuit according to claim 2, wherein said switch controller includes:
a first comparator which compares the output voltage with the lower-limit voltage;
a second comparator which compares the output voltage with the upper-limit voltage; and
a flip-flop which is set or reset in accordance with an output of the first comparator and an output of the second comparator,
wherein said switch controller complementarily turns on and off said first switch and said second switch, based on an output of the flip-flop.

5. A triangular wave generation circuit according to claim 1, wherein said switch controller includes a hysteresis comparator that compares the output voltage with the upper-limit voltage and the lower-limit voltage serving as threshold value voltages, and said switch controller complementarily turns on and off said first switch and said second switch based on an output of the hysteresis comparator.

6. A triangular wave generation circuit according to claim 2, wherein said switch controller includes a hysteresis comparator that compares the output voltage with the upper-limit voltage and the lower-limit voltage serving as threshold value voltages, and said switch controller complementarily turns on and off said first switch and said second switch based on an output of the hysteresis comparator.

7. A semiconductor integrated circuit including a triangular wave generation circuit according to claim 1.

8. A semiconductor integrated circuit including a triangular wave generation circuit according to claim 2.

9. A pulse-width modulator, comprising:
a triangular wave generation circuit according to claim 1;
an error amplifier which amplifies error between a voltage to be controlled and a predetermined reference voltage; and
a comparator which compares an error voltage output from said error amplifier and an output voltage of said triangular wave generation circuit.

10. A pulse-width modulator, comprising:
a triangular wave generation circuit according to claim 2;
an error amplifier which amplifies error between a voltage to be controlled and a predetermined reference voltage; and a comparator which compares an error voltage output from said error amplifier and an output voltage of said triangular wave generation circuit.

11. A switching regulator including a pulse-width modulator according to claim 9.

12. A switching regulator including a pulse-width modulator according to claim 10.

* * * * *